United States Patent [19]

Beckers et al.

[11] Patent Number: 5,322,592
[45] Date of Patent: Jun. 21, 1994

[54] POTASSIUM-LITHIUM-NIOBATE CRYSTALS AND THE MANUFACTURE THEREOF

[75] Inventors: Lucas J. A. M. Beckers; Johannes F. M. Cillessen; Martin Ouwerkerk, all of Eindhoven, Netherlands

[73] Assignee: U.S. Philips Corporation, New York, N.Y.

[21] Appl. No.: 952,024

[22] Filed: Sep. 28, 1992

[30] Foreign Application Priority Data

Oct. 1, 1991 [EP] European Pat. Off. ........ 91202551.7

[51] Int. Cl.$^5$ ................................................ C30B 7/00
[52] U.S. Cl. .................................... 117/80; 372/21; 117/948
[58] Field of Search ....... 156/624, DIG. 71, DIG. 87, 156/DIG. 106; 372/21, 22, 34

[56] References Cited

U.S. PATENT DOCUMENTS

| | | | |
|---|---|---|---|
| 3,971,938 | 7/1976 | O'Hare | 250/336 |
| 4,879,722 | 11/1989 | Dixon et al. | 372/21 |
| 4,884,276 | 11/1989 | Dixon et al. | 372/21 |
| 4,933,947 | 6/1990 | Anthon et al. | 372/34 |
| 5,038,352 | 8/1991 | Lenth et al. | 372/21 |
| 5,218,661 | 6/1993 | Droste et al. | 385/112 |

FOREIGN PATENT DOCUMENTS 0409339 1/1991 European Pat. Off. .

Primary Examiner—Olik Chaudhuri
Assistant Examiner—Felisa Garrett
Attorney, Agent, or Firm—Norman N. Spain

[57] ABSTRACT

The invention provides a method of manufacturing potassium-lithium-niobate crystals having a composition which corresponds to the formula $$(K_2O)_{0.3}(Li_2O)_{0.2+a}(Nb_2O_5)_{0.5+b}$$

where
$-0.01 < a < 0.01$
$-0.005 < b < 0.005$ from a melt comprising potassium, lithium and niobium compounds. By adding a small quantity of vanadium, preferably in the form of $V_2O_5$, considerably larger crystals are obtained. In addition, the homogeneity of these crystals is much better than that of the crystals obtained by the method according to the prior art.

7 Claims, No Drawings

POTASSIUM-LITHIUM-NIOBATE CRYSTALS AND THE MANUFACTURE THEREOF

BACKGROUND OF THE INVENTION

The invention relates to a method of manufacturing potassium-lithium-niobate crystals having a composition which corresponds to the formula $$(K_2O)_{0.3}(Li_2O)_{0.2+a}(Nb_2O_5)_{0.5+b}$$

where
$-0.01 < a < 0.01$
$-0.005 < b < 0.005$
from a melt comprising potassium, lithium and niobium compounds. The invention also relates to crystals of this composition.

The above-mentioned monocrystalline crystals can be used in devices for doubling the frequency of a light wave. In these devices, this so-called primary wave is passed through a nonlinear optical medium of potassium-lithium-niobate (PLN), thereby forming a so-called second harmonic wave. The frequency of the latter wave is twice that of the primary wave.

The method described in the opening paragraph is known from, inter alia, European Patent Application EP 409.339. The method described therein enables stoichiometric potassium-lithium-niobate (PLN) having a non-centrosymmetrical tetragonal crystal structure of the tungsten bronze type to be manufactured. Using this material, the frequency of primary waves having a wavelength in the frequency range 790-920 nm can be doubled at room temperature. The known material also exhibits a high degree of birefringence in this frequency range, so that optimum phase matching of the (infra)red light (primary wave) and blue light (second harmonic wave) is possible. As the wavelength of the radiation issuing from the current semiconductor lasers, such as (Al,Ga)As lasers is situated in the range around 800 nm, the known material is very suitable for use in combination with such lasers. The generated shortwave light can be used for the high-density storage of information and for reading said information, for example in high-density data recording.

Applicants have found that the disadvantage of the known method is that the crystals manufactured are relatively small. For example, up to now it has been impossible to grow crystals having a crystal volume in excess of 3.5 mm³. This crystal volume is insufficient to allow said crystals to be successfully used in devices for frequency doubling. Besides, these relatively small crystals exhibited cracks and their composition was insufficiently homogeneous.

SUMMARY OF THE INVENTION

It is an object of the invention to overcome said disadvantages. The invention more particularly aims at providing a method of manufacturing relatively large PLN crystals having a homogeneous composition. The crystals manufactured according to the intended method must have a crystal volume in excess of 10 mm³, and preferably in excess of 60 mm³.

These objects are achieved by a method of the type mentioned in the opening paragraph, which method is characterized according to the invention in that the melt also comprises a vanadium compound.

The method according to the invention enables PLN crystals to be manufactured whose size considerably exceeds the crystal size attainable by the method according to the prior art. For example, crystals having dimensions of minimally 10 mm by 4 mm by 1.5 mm (crystal volume 60 mm³!) can be obtained in a simple manner. Moreover, the crystals thus manufactured are of a very homogeneous composition. For example, by means of X-ray analysis, no phases of the undesired $Li_3NbO_4$ can be observed in the crystals manufactured by the method according to the invention. Besides, the crystals are free of cracks.

The exact function of the added vanadium compound in the process of crystallizing PLN is (as yet) unclear. Possibly, said compound catalyses the conversion of $Li_2CO_3$, which is stable per se, into $Li_2O$ in the melt. $Li_2CO_3$ may be present in the melt as a parent compound. If another Li compound is used as the parent compound, $Li_2CO_3$ may be formed in the melt by capturing $CO_2$ in the melt from the atmosphere. The addition of only 0.1 at. % of vanadium relative to the overall metal content of the melt already has a favorable effect on the size and quality of the PLN crystals obtained. The overall metal content of the melt is to be understood to mean herein the sum of the quantities of Li, P and Nb ions in the melt. It has been found that the vanadium added is not incorporated in the tetragonal crystal structure of the crystalline PLN.

DETAILED DESCRIPTION OF THE INVENTION

An advantageous embodiment of the method according to the invention is characterized in that the vanadium content of the melt is less than 10 at. % calculated with respect to the overall metal content of the melt. A larger quantity of said compound increases the risk that phases other than the intended tetragonal PLN phase are formed in the crystals. This adversely affects the homogeneity of the crystals. If vanadium is added in a quantity of 20 at. % or more, PLN no longer crystallizes in the melt. Optimum results are obtained when, relative to the overall metal content, 1 at. % of vanadium, in the form of a vanadium compound, is added to the melt.

It has been found that all kinds of vanadium compounds can be used in the method according to the invention. Favorable results are obtained with $V_2O_5$, $KVO_3$, $LiVO_3$ and $K_{0.6}Li_{0.4}VO_3$. The compound $V_2O_5$ has the additional practical advantage that when a specific quantity by weight of said compound is introduced into the melt, adaptations in the weight of the other components of the melt do not have to be taken into account. It is alternatively possible to add a mixture of various vanadium compounds to the melt.

The invention also relates to a potassium-lithium-niobate crystal having a composition which corresponds to the formula $$(K_2O)_{0.3}(Li_2O)_{0.2+a}(Nb_2O_5)_{0.5+b}$$

where
$-0.01 < a < 0.01$
$-0.005 < b < 0.005$.
This crystal is characterized in that its volume is minimally 10 mm³.

The invention will be explained in greater detail by means of exemplary embodiments.

EXEMPLARY EMBODIMENTS

A quantity of 538.84 g of $K_2CO_3$, 250.48 g of $Li_2CO_3$, 1428.52 g of $Nb_2O_5$ and 22.72 g of $V_2O_5$ in powder form are thoroughly mixed and melted in a melting crucible of Pt at 1050° C. To optimize its homogeneity, the melt was maintained at this temperature for approximately 6 hours. Subsequently, the melt was rapidly cooled to the crystallization temperature of PLN, i.e. 975° C. A seed crystal was suspended in the melt. Crystal growth of PLN at the seed crystal was obtained by subsequently cooling the melt to 970° C. at a rate of 1° C. per day. The melt was maintained at this temperature until crystals of the desired size were obtained. Subsequently, the flux was cooled to room temperature at a rate of 5°–10° C. per hour. The crystals exhibited a crystal volume of 60 $mm^3$ (dimensions: 10 mm by 4 mm by 1.5 mm) or more. The dimensions of the largest PLN crystal thus obtained were 8 mm by 8 mm by 2.5 mm (volume 160 $mm^3$). X-ray experiments showed that no undesired foreign phases were present in the monocrystalline material. Nor were there any cracks. The composition of these crystals was $K_3Li_{1.97}Nb_{5.03}O_{15.06}$. ICP-emission spectrometry analysis of the crystals thus manufactured showed that no vanadium was incorporated in the crystal lattice (detection limit of vanadium: 7 ppm). Crystals of the said composition are particularly suitable for the direct phase matching of 821 nm red laser light at room temperature. It has been established that the frequency doubling efficiency of the crystals is $13.5 \pm 2$ pm/V.

In a comparative test the method described in the preceding paragraph was repeated under equal conditions and using the same PLN composition, except that during the crystallization of PLN no vanadium compound was present in the melt. The crystals obtained were very small. The volume of the largest crystal was 3.2 $mm^3$ (dimensions: 2.5 mm by 2.5 mm by 0.5 mm). It was found that the crystals were not completely free of heterologous crystalline inclusions. A considerable number of the crystals exhibited cracks.

Determining the optimum melt included carrying out a series of crystallizations in which the concentration of the vanadium compound was varied. When 20 at. % of vanadium in the form of $V_2O_5$ was added to the melt per mol of metal ions (Li, P and Nb), the formation of PLN was completely suppressed. Under these conditions no crystal growth was observed. When 10 at. % of vanadium was added to the melt, the quality and size of the PLN crystals obtained increased still noticeably relative to tests in which no vanadium was added. Optimum results were obtained when approximately 1 at. % of vanadium was added to the melt.

We claim:

1. A method of manufacturing potassium-lithium-niobate crystals having a volume of at least 10 $mm^3$ and a composition which corresponds to the formula $$(K_2O)_{0.3}(Li_2O)_{0.2+a}(Nb_2O_5)_{0.5+b}$$

where
$-0.01 < a < 0.01$
$-0.005 < b < 0.005$
from a melt comprising potassium, lithium and niobium compounds, characterized in that the melt also comprises a vanadium compound.

2. A method as claimed in claim 1, characterized in that the vanadium content of the melt is less than 10 at. %, calculated with respect to the overall metal content of the melt.

3. A method as claimed in claim 2, characterized in that $V_2O_5$ is used as the vanadium compound.

4. A method of manufacturing potassium-lithium-niobate crystals having a volume of at least 10 $mm^3$ and a composition which corresponds to the formula $$(K_2O)_{0.3}(Li_2O)_{0.2+a}(Nb_2O_5)_{0.5+b}$$

where
$-0.01 < a < 0.01$
$-0.005 < b < 0.005$
by growing said crystals on a seed crystal suspended in a melt comprising potassium, lithium and niobate compounds, characterized in that the melt also comprises a vanadium compound in an amount so that the vanadium content of the melt, calculated with respect to the overall metal content of the melt, is from about 0.1 at .% to less than 10 at .%.

5. The method of claim 1 wherein the vanadium content of the melt calculated with respect to the overall metal content of the melt is about 1 at .%.

6. The method of claim 4 wherein the vanadium compound is selected from the group consisting of $V_2O_5$, $KVO_3$, $LiVO_3$ and $K_{0.6}Li_{0.4}VO_3$.

7. The method of claim 6 wherein the vanadium compound is $V_2O_5$.

* * * * *